US012610680B1

(12) United States Patent (10) Patent No.: US 12,610,680 B1
Yang (45) Date of Patent: Apr. 21, 2026

(54) PEROVSKITE PHOTOELECTRIC CONVERSION SEMICONDUCTOR DEVICE

(71) Applicant: INDUSTRY-ACADEMIC COOPERATION FOUNDATION, KUNSAN NATIONAL UNIVERSITY, Gunsan-si (KR)

(72) Inventor: JungYup Yang, Gunsan-si (KR)

(73) Assignee: INDUSTRY-ACADEMIC COOPERATION FOUNDATION, KUNSAN NATIONAL UNIVERSITY, Gunsan-si (KR)

( * ) Notice: Subject to any disclaimer, the term of this patent is extended or adjusted under 35 U.S.C. 154(b) by 0 days.

(21) Appl. No.: 19/232,235

(22) Filed: Jun. 9, 2025

(30) Foreign Application Priority Data

Dec. 9, 2024 (KR) ........................ 10-2024-0181491

(51) Int. Cl.
 *H10K 30/40* (2023.01)
 *H10K 30/82* (2023.01)
(52) U.S. Cl.
 CPC ........... *H10K 30/40* (2023.02); *H10K 30/821* (2023.02)
(58) Field of Classification Search
 CPC ............................. H10K 30/40; H10K 30/821
 See application file for complete search history.

(56) References Cited

U.S. PATENT DOCUMENTS

2022/0344530 A1 10/2022 Chang et al.
2023/0141956 A1 5/2023 Chen et al.

FOREIGN PATENT DOCUMENTS

| CN | 114023889 | A | * | 2/2022 | ............. H10K 30/81 |
|----|-----------|---|---|--------|--------------------------|
| KR | 2000-0060348 | A | | 10/2000 | |
| KR | 10-2018-0051019 | A | | 5/2018 | |
| KR | 10-2022-0012704 | A | | 2/2022 | |
| KR | 102472006 | B1 | | 11/2022 | |
| KR | 10-2023-0125877 | A | | 8/2023 | |
| KR | 10-2024-0034468 | A | | 3/2024 | |
| WO | WO-2015001984 | A1 | * | 1/2015 | ........... H01G 9/2018 |
| WO | 2021200286 | A1 | | 10/2021 | |
| WO | WO-2023237190 | A1 | * | 12/2023 | ............. H10K 30/40 |
| WO | 2024247789 | A1 | | 12/2024 | |

(Continued)

OTHER PUBLICATIONS

English machine translation of WO-2015001984-A1 (Year: 2025).*

(Continued)

*Primary Examiner* — Angelo Trivisonno
(74) *Attorney, Agent, or Firm* — Armstrong Teasdale LLP

(57) ABSTRACT

Disclosed herein is a perovskite photoelectric conversion semiconductor device. A perovskite photoelectric conversion semiconductor device includes a substrate, a first electrode formed on the substrate, an electron transport layer formed on the first electrode, a perovskite light absorbing semiconductor layer formed on the electron transport layer, a hole transport layer formed on the perovskite light absorbing semiconductor layer, and a second electrode formed on the hole transport layer, a first pitch is formed in the first electrode, a second pitch is formed in the electron transport layer, the perovskite light absorbing semiconductor layer, and the hole transport layer, and the electron transport layer includes an electron transport layer residue in the second pitch.

13 Claims, 5 Drawing Sheets

(56)  References Cited

FOREIGN PATENT DOCUMENTS

WO        2025047741  A1      3/2025

OTHER PUBLICATIONS

English machine translation of CN 114023889 A (Year: 2025).*
Palma, Alessandro Lorenzo et al., "Laser-Patterning Engineering
for Perovskite Solar Modules with 95% Aperture Ratio," IEEE
Journal of Photovoltaics, vol. 7, No. 6, Nov. 2017, pp. 1674-1680.

* cited by examiner

PEROVSKITE PHOTOELECTRIC CONVERSION SEMICONDUCTOR DEVICE

CROSS-REFERENCE TO RELATED APPLICATION

This application claims the benefit of Korean Patent Application No. 10-2024-0181491 filed on Dec. 9, 2024, in the Korean Intellectual Property Office, the entire disclosure of which is incorporated herein by reference for all purposes.

BACKGROUND

1. Field of the Invention

One or more embodiments relate to a perovskite photoelectric conversion semiconductor device.

2. Description of the Related Art

Large-area perovskite photoelectric conversion semiconductor devices are not yet commercialized and remain in the research stage. In order to form a device on a large area, it is necessary to perform a patterning process to form a multilayer thin film on a glass substrate and then separate it. The most commonly used method in the related art is a monolithic pattern structure.

The monolithic pattern structure is a form in which a number of thin and long cells are connected in series through a patterning process on a large-area glass substrate when manufacturing a module of a large-area photoelectric conversion semiconductor device.

In order to form the monolithic pattern structure, the patterning process (etching processes) is performed three times in total. A first patterning process P1 is to pattern a transparent electrode placed on a glass substrate, and an etching process using a laser is generally used.

A second patterning process P2 is to pattern at least three layers including an electron transport layer (or hole transport layer)/perovskite layer/hole transport layer (or electron transport layer), and in this case, laser scribing using laser or mechanical scribing may be used.

Finally, a third patterning process P3 is to etch an electron transport layer (or hole transport layer)/perovskite layer/hole transport layer (or electron transport layer)/upper electrode after forming the upper electrode, and laser scribing using laser or mechanical scribing may also be used in this case.

The etching processes P2 and P3 have the disadvantages that, when using a laser, a thickness of each layer to be etched is required to be constant, and when each material is changed, the same process conditions may not be used, and the process may not be carried out after establishing new process conditions. It also has the disadvantage of having to use expensive lasers (short wavelength and short pulse width), and thus the patterning process using mechanical etching is preferred in some cases.

When performing the process using laser etching or mechanical methods, particularly, in the etching process P2, only at least three layers such as the electron transport layer (or hole transport layer)/perovskite layer/hole transport layer (or electron transport layer), excluding the transparent electrode, are required to be etched. However, performing an excessive etching process at this time causes significant damage to the multilayer thin films.

The above description has been possessed or acquired by the inventor(s) in the course of conceiving the present disclosure and is not necessarily an art publicly known before the present application is filed.

SUMMARY

Embodiments provide a perovskite photoelectric conversion semiconductor device including a portion of an electron transport layer or a hole transport layer having a minimum thickness and a minimum area ratio to not cause damage to multilayer thin films by not performing an excessive etching process.

However, technical goals to be achieved are not limited to those described above, and other goals not mentioned above can be clearly understood by one of ordinary skill in the art from the following description.

According to an aspect, there is provided a perovskite photoelectric conversion semiconductor device including a substrate, a first electrode formed on the substrate, an electron transport layer formed on the first electrode, a perovskite light absorbing semiconductor layer formed on the electron transport layer, a hole transport layer formed on the perovskite light absorbing semiconductor layer, and a second electrode formed on the hole transport layer, wherein a first pitch is formed in the first electrode, a second pitch is formed in the electron transport layer, the perovskite light absorbing semiconductor layer, and the hole transport layer, and the electron transport layer includes an electron transport layer residue in the second pitch.

According to another aspect, there is provided a perovskite photoelectric conversion semiconductor device including a substrate, a first electrode formed on the substrate, a hole transport layer formed on the first electrode, a perovskite light absorbing semiconductor layer formed on the hole transport layer, an electron transport layer formed on the perovskite light absorbing semiconductor layer, and a second electrode formed on the electron transport layer, wherein a first pitch is formed in the first electrode, a second pitch is formed in the hole transport layer, the perovskite light absorbing semiconductor layer, and the electron transport layer, and the hole transport layer includes a hole transport layer residue in the second pitch.

The electron transport layer residue or the hole transport layer residue may have a thickness range of 0.1 nanometers (nm) to 2 nm.

The electron transport layer residue or the hole transport layer residue may be included in an area of 0.05% to 99% on the first electrode in the second pitch.

The electron transport layer residue or the hole transport layer residue may be formed locally.

The electron transport layer residue or the hole transport layer residue may be formed by laser patterning, mechanical scribing, or both.

The electron transport layer or the hole transport layer may be formed to cover at least a portion of the first electrode and the substrate.

The second electrode may be formed to cover at least a portion of the first electrode, the electron transport layer, the perovskite light absorbing semiconductor layer, and the hole transport layer.

A third pitch may be formed in the electron transport layer, the hole transport layer, the perovskite light absorbing semiconductor layer, and the second electrode.

The electrode, the second electrode, or both may be a transparent electrode or a metal electrode.

The transparent electrode comprises one or more selected from the group consisting of indium tin oxide (ITO), fluorine-doped tin oxide (FTO), $SnO_2$, Al:ZnO, B-doped ZnO (B:ZnO), graphene, poly(3,4-ethylenedioxythiophene) poly-styrene sulfonate (PEDOT:PSS), Ag nanowires, and graphene and carbon nanotubes.

The metal electrode may include one or more selected from the group consisting of Au, Ag, Ni, Cu, Mo, Pt, W, Al, and an alloy thereof.

The electron transport layer may further include one or more selected from the group consisting of $TiO_2$, $SnO_2$, $WS_2$, $WSe_2$, ZnO, and $C_{60}$.

The hole transport layer may further include one or more selected from the group consisting of $NiO_x$, Spiro-OMeTAD, PTAA, $P_3HT$, PEDOT:PSS, and a self-assembled monolayer.

The perovskite light absorbing semiconductor layer may include a compound having an $ABX_3$ structure.

The A may be one or more selected from the group consisting of methylammonium, formamidinium, Cs, and Rb.

The B may be one or more selected from the group consisting of Pb, Sn, Ge, Sb, and Bi, and the X may be one or more selected from the group consisting of I, Br, and Cl.

The perovskite light absorbing semiconductor layer may be a large-area photoelectric conversion module and may be electrically connected by connecting a plurality of cells in series in a monolithic structure.

Additional aspects of example embodiments will be set forth in part in the description which follows and, in part, will be apparent from the description, or may be learned by practice of the disclosure.

According to embodiments, a perovskite photoelectric conversion semiconductor device includes an electron transport layer or a hole transport layer having a minimum thickness and a minimum area ratio on a transparent electrode, thereby not causing damage to other layers and simplifying the process by not performing the excessive etching process.

BRIEF DESCRIPTION OF THE DRAWINGS

These and/or other aspects, features, and advantages of the invention will become apparent and more readily appreciated from the following description of example embodiments, taken in conjunction with the accompanying drawings of which.

DETAILED DESCRIPTION

Figure 1:
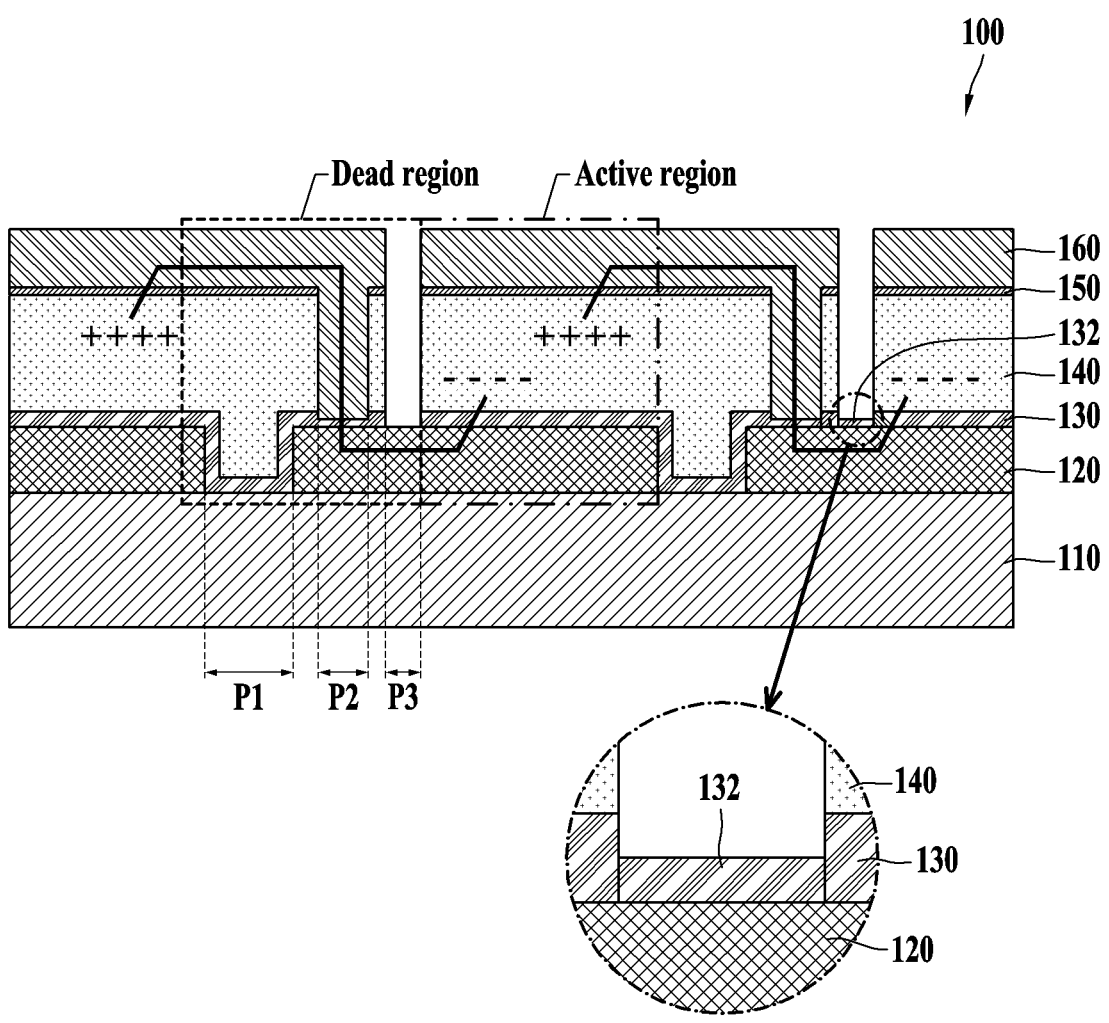
FIG. 1 is a cross-sectional view of a perovskite photoelectric conversion semiconductor device according to an embodiment of the present disclosure.

Hereinafter, embodiments will be described in detail with reference to the accompanying drawings. However, various alterations and modifications may be made to the embodiments. Here, the embodiments are not construed as limited to the disclosure. The embodiments should be understood to include all changes, equivalents, and replacements within the idea and the technical scope of the disclosure.

The terminology used herein is for the purpose of describing particular embodiments only and is not to be limiting of the embodiments. The singular forms "a," "an," and "the" are intended to include the plural forms as well, unless the context clearly indicates otherwise. It will be further understood that the terms "comprises/comprising" and/or "includes/including" when used herein, specify the presence of stated features, integers, steps, operations, elements, and/or components, but do not preclude the presence or addition of one or more other features, integers, steps, operations, elements, components and/or groups thereof.

Unless otherwise defined, all terms including technical and scientific terms used herein have the same meaning as commonly understood by one of ordinary skill in the art to which the embodiments belong. Terms, such as those defined in commonly used dictionaries, are to be interpreted as having a meaning that is consistent with their meaning in the context of the relevant art and the present disclosure, and are not to be interpreted in an idealized or overly formal sense unless expressly so defined herein.

When describing the embodiments with reference to the accompanying drawings, like reference numerals refer to like components and a repeated description related thereto will be omitted. In the description of embodiments, detailed description of well-known related structures or functions will be omitted when it is deemed that such description will cause ambiguous interpretation of the present disclosure.

In addition, terms such as first, second, A, B, (a), (b), and the like may be used to describe components of the embodiments. These terms are used only for the purpose of discriminating one component from another component, and the nature, the sequences, or the orders of the components are not limited by the terms.

The same name may be used to describe an element included in the embodiments described above and an element having a common function. Unless otherwise mentioned, the descriptions on the embodiments may be applicable to the following embodiments and thus, duplicated descriptions will be omitted for conciseness.

Hereinafter, a perovskite photoelectric conversion semiconductor device of the present disclosure will be described in detail with reference to embodiments and drawings. However, the present disclosure is not limited to the embodiments and drawings.

A perovskite photoelectric conversion semiconductor device according to an embodiment of the present disclosure includes a substrate, a first electrode formed on the substrate, an electron transport layer formed on the first electrode, a perovskite light absorbing semiconductor layer formed on the electron transport layer, a hole transport layer formed on the perovskite light absorbing semiconductor layer, and a second electrode formed on the hole transport layer, a first pitch is formed in the first electrode, a second pitch is formed in the electron transport layer, the perovskite light absorbing semiconductor layer, and the hole transport layer, and the electron transport layer includes an electron transport layer residue in the second pitch.

FIG. 1 is a cross-sectional view of a perovskite photoelectric conversion semiconductor device according an embodiment of the present disclosure.

Referring to FIG. 1, a perovskite photoelectric conversion semiconductor device 100 according to an aspect of the present disclosure may include a substrate 110, a first electrode 120 formed on the substrate 110, an electron transport layer 130 formed on the first electrode 120, a perovskite light absorbing semiconductor layer 140 formed on the electron transport layer 130, a hole transport layer 150 formed on the perovskite light absorbing semiconductor layer 140, and a second electrode 160 formed on the hole transport layer 150.

The perovskite photoelectric conversion semiconductor device of FIG. 1 has a negative-intrinsic-positive (NIP) structure.

The substrate 110 may include a substrate formed of glass or flexible plastic. For example, for the substrate 110, a glass substrate, a plastic substrate including at least one selected from the group consisting of polyethylene terephthalate (PET), polyethylenenaphthelate (PEN), polypropylene (PP), polyamide (PI), tri acetyl cellulose (TAC), and polyether-sulfone (PES), or a flexible substrate including aluminum foil, stainless steel foil, or both may be used. However, the flexible substrate including aluminum foil, stainless steel foil, or both among flexible substrates has a conductive material that conducts electricity well. Accordingly, in this case, an insulating layer that insulates electricity should be formed on the flexible substrate.

Any substrate may be used as the substrate 110 as long as it is a transparent substrate. Sunlight incident from the substrate may be absorbed by the perovskite light absorbing semiconductor layer to form electron-hole pairs from the light absorbing layer, thereby generating electricity. Therefore, it is desirable to use a substrate with low haze that may cause a large amount of sunlight to be incident thereto.

If the substrate 110 is a non-transparent substrate, the first electrode formed on the substrate should be in the form of a metal electrode, the second electrode should be in the form of a transparent electrode, and a portion where the sunlight is incident should be the portion of the second electrode.

When a non-transparent substrate is used, it is necessary to provide a configuration of transparent conductive oxide (TCO)/hole transport layer or electron transport layer/perovskite layer/electron transport layer, or hole transport layer/metal electrode/substrate.

The perovskite photoelectric conversion semiconductor device 100 of the present disclosure may be a large-area perovskite photoelectric conversion semiconductor device having a monolithic pattern structure.

A monolithic pattern structure is a scheme of connecting a plurality of cells in series over a large area, and may generally be manufactured using three thin film patterning processes. According to an embodiment of the present disclosure, the first electrode 120, the second electrode 160, or both, may be a transparent electrode or a metal electrode.

The first electrode 120, the second electrode 160, or both may be a transparent electrode, and when the transparent electrode is used, the transparent electrode may help sunlight be incident to the perovskite light absorbing semiconductor layer.

In addition, it is desirable that the electrode on a surface where sunlight is incident is a transparent electrode, and this is for increasing the amount of the sunlight absorbed by the perovskite light absorbing semiconductor layer of the present disclosure.

When the first electrode 120 is a metal electrode, it is advantageous that a large-area perovskite photoelectric conversion semiconductor device with a monolithic pattern structure may be manufactured using a substrate structure.

When the first electrode 120 is a transparent electrode, it is advantageous that a large-area perovskite photoelectric conversion semiconductor device with a monolithic pattern structure may be manufactured using a superstrate structure.

In addition, the first electrode 120 preferably has a thickness smaller than that of the substrate, and the thickness of the first electrode 120 may be desirably 30 nanometers (nm) to 1,500 nm.

The transparent electrode may include one or more selected from the group consisting of indium tin oxide (ITO), fluorine-doped tin oxide (FTO), $SnO_2$, Al:ZnO, B-doped ZnO (B:ZnO), graphene, poly(3,4-ethylenedioxy-thiophene) polystyrene sulfonate (PEDOT:PSS), Ag nanowires, and graphene and carbon nanotubes (CNT).

The metal electrode may include one or more selected from the group consisting of Au, Ag, Ni, Cu, Mo, Pt, W, Al, and an alloy thereof. However, the metal electrode is not limited to the materials described above, and most metal materials may be used.

Desirably, the transparent electrode may be ITO or FTO, and the metal electrode may be Ag, Au, or molybdenum.

According to an embodiment of the present disclosure, a first pitch PI may be formed in the first electrode 120, and the electron transport layer 130 may be formed to cover at least a portion of the first electrode 120 and the substrate.

Referring to FIG. 1, the formation of the first pitch PI may be seen.

The first electrode 120 may be formed on a substrate 110 and then patterned to form the first pitch, and the electron transport layer 130 may be formed on an upper surface and side surfaces of the first electrode 120 as well as on an upper surface of the substrate 110 exposed by the first pitch.

At this time, the electron transport layer 130 may maintain a constant thickness, and may desirably have a thickness of 10 nm to 500 nm. The optimal thickness varies depending on the material and device structure, however, generally, when the thickness of the electron transport layer 130 is less than 10 nm, a thickness of a film may not be constant, and when the thickness exceeds 500 nm, there is a problem that the resistance excessively increases. A second pitch P2 may be formed in the electron transport layer 130, the perovskite light absorbing semiconductor layer 140, and the hole transport layer 150, and the second electrode 160 may be formed to cover at least a portion of the first electrode 120, the electron transport layer 130, the perovskite light absorbing semiconductor layer 140, and the hole transport layer 150.

The second pitch may be formed by patterning the electron transport layer 130, the perovskite light absorbing semiconductor layer 140, and the hole transport layer 150 for electrical conduction between separated cells.

The second pitch may include an electron transport layer residue 132.

In an embodiment, the electron transport layer residue 132 may have a thickness range of 0.1 nm to 2 nm; 0.1 nm to 1.8 nm; 0.1 nm to 1.5 nm; 0.1 nm to 1.3 nm; 0.1 nm to 1 nm; 0.1 nm to 0.8 nm; 0.1 nm to 0.5 nm; 0.1 nm to 0.3 nm; 0.5 nm to 2 nm; 0.5 nm to 1.8 nm; 0.5 nm to 1.5 nm; 0.5 nm to 1.3 nm; 0.5 nm to 1 nm; 0.5 nm to 0.8 nm; 1 nm to 2 nm; 1 nm to 1.8 nm; 1 nm to 1.5 nm; 1 nm to 1.3 nm; 1.5 nm to 2 nm; or 1.5 nm to 1.8 nm.

In an embodiment, the electron transport layer residue 132 may remain in an area of 0.05% to 99%; 0.05% to 90%; 0.05% to 80%; 0.05% to 70%; 0.05% to 60%; 0.05% to 50%; 0.05% to 40%; 0.05% to 30%; 0.05% to 20%; 0.05% to 10%; 0.05% to 5%; 0.05% to 1%; 1% to 90%; 1% to 80%; 1% to 70%; 1% to 60%; 1% to 50%; 1% to 40%; 1% to 30%; 1% to 20%; 1% to 10%; 10% to 99%; 10% to 90%; 10% to 80%; 10% to 70%; 10% to 60%; 10% to 50%; 10% to 40%; 10% to 30%; 10% to 20%; 30% to 99%; 30% to 90%; 30% to 80%; 30% to 70%; 30% to 60%; 30% to 50%; 30% to 40%; 50% to 99%; 50% to 90%; 50% to 80%; 50% to 70%;

50% to 60%; 80% to 99%; 80% to 90%; or 90% to 99% on the first electrode 120 in the second pitch.

Figure 2:
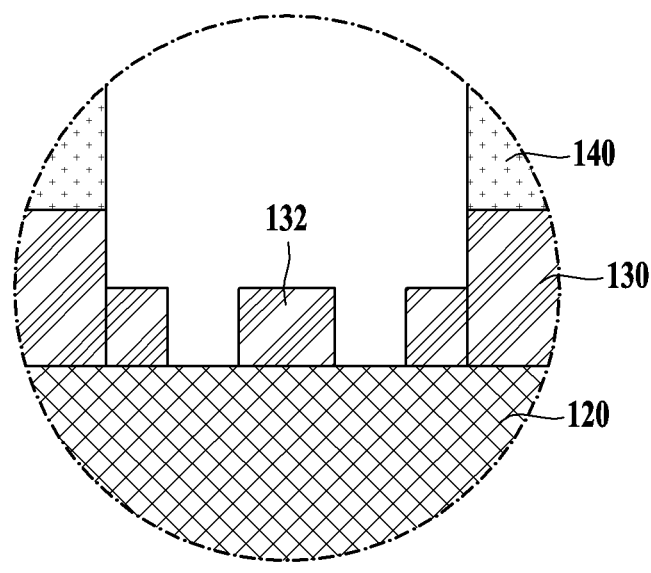
FIG. 2 is an enlarged view illustrating a form of an electron transport layer residue according to another embodiment of the present disclosure.

FIG. 2 is an enlarged view illustrating a form of an electron transport layer residue according to another embodiment of the present disclosure.

Referring to FIG. 2, the electron transport layer residue 132 may not have a constant thickness and may be formed locally. The electron transport layer residue 132 may be formed with an irregular thickness.

In an embodiment, the electron transport layer residue 132 may be formed by laser patterning, mechanical scribing, or both.

The laser patterning may be at least one selected from the group consisting of Nd:YAG (neodymium-doped yttrium aluminum garnet; $Nd:Y_3Al_5O_{12}$), neodymium-doped yttrium orthovanadate (Nd; $YVO_4$), diode, KrF, and $CO_2$ gas laser, and a wavelength of the laser may be 200 nm to 1,064 nm.

The duration of a laser pulse used in the laser patterning may be 100 nanoseconds (nsec) or less, and desirably 10 picoseconds (psec) to 100 nsec.

The electron transport layer residue 132 has the advantage of strengthening the adhesion strength between the second electrode and the first electrode. Normally, when a metal electrode (such as an Au or Ag thin film), which is the second electrode, is deposited and attached to a transparent electrode which is the first electrode, the adhesion strength is poor due to a difference in crystal structure and surface energy between the two thin films. Thus, methods of improving the adhesion strength may be used by forming a seed layer of Ti, Ni, Cr, etc. The electron transport layer residue 132 is an oxide-based material and has high adhesion strength compared to that of the metal/transparent electrode. Also, when the electron transport layer residue partially remains, a surface area increases and the adhesion strength increases. When the adhesion strength is poor, there is a very high possibility that a problem arises in the long-term reliability of a large-area photoelectric conversion semiconductor device in the future.

In the case of laser patterning, laser energy or the number of patterning cycles may be increased to completely remove the electron transport layer residue, however, this may cause laser damage to other multilayer thin films. In addition, in the case of mechanical patterning scribing, a pressing force during the mechanical etching or the number of etchings may be increased to completely remove the electron transport layer residue, however, this may cause damage to the transparent electrode and glass substrate. Therefore, the excessive etching process may not be performed, and this may not cause the damage to the multilayer thin films and the process may also be simplified.

The second pitch may be formed to conduct electricity between the perovskite light absorbing semiconductor layers 140 of the separated cells, thereby allowing positive and negative charges to be formed at opposite ends within the perovskite light absorbing semiconductor layer 140.

More specifically, positive charges may be formed at the interface between the perovskite light absorbing semiconductor layer 140 and the second electrode 160, and negative charges may be formed at the interface between the perovskite light absorbing semiconductor layer 140 and the first electrode 120.

In addition, partitioned cells may be connected in series as a whole by being connected from a positive charge forming portion of the perovskite light absorbing semiconductor layer 140 in the partitioned cell to a negative charge forming portion of the perovskite layer in an adjacent cell.

According to an embodiment of the present disclosure, a third pitch P3 may be formed in the electron transport layer 130, the perovskite light absorbing semiconductor layer 140, the hole transport layer 150, and the second electrode 160.

The third pitch may serve to partition a photoelectric conversion module of the present disclosure formed with a monolithic pattern structure into cells.

The electron transport layer 130 may further include one or more selected from the group consisting of $TiO_2$, $SnO_2$, $WS_2$, $WSe_2$, ZnO, and $C_{60}$, and the hole transport layer may further include one or more selected from the group consisting of $NiO_x$, Spiro-OMeTAD, PTAA, $P_3HT$, PEDOT: PSS, and a self-assembled monolayer.

The electron transport layer may include an N-type semiconductor material, and the hole transport layer may include a P-type semiconductor material.

According to an embodiment of the present disclosure, the perovskite light absorbing semiconductor layer may include a compound having an $ABX_3$ structure, the A may be one or more selected from the group consisting of methyl-ammonium, formamidinium, Cs, and Rb, the B may be one or more selected from the group consisting of Pb, Sn, Ge, Sb, and Bi, and the X may be one or more selected from the group consisting of I, Br, and Cl.

According to an embodiment of the present disclosure, the perovskite light absorbing semiconductor layer may include one or more selected from the group consisting of $MAPbI_3$, $FAPbI_3$, $CsPbI_3$, $MAPbBr_3$, $FAMAPbI_3$, $FAMAPbBr_3$, $CsFAMAPbI_3$, $CsFAMAPbBr_3$, $CsFAMAPbCl_3$, CsFAMAPb $(I,Br)_3$, $MASnI_3$, $FASnI_3$, $CsSnI_3$, $MASnBr_3$, $FAMASnI_3$, $FAMASnBr_3$, CsFA-$MASnI_3$, $CsFAMASnBr_3$, $CsFAMASnCl_3$, and CsFAMASn $(I,Br)_3$.

The perovskite light absorbing semiconductor layer is a portion that absorbs sunlight and forms excitons, and desirably has a thickness of 20 nm to 2,000 nm. More preferably, the thickness of the perovskite light absorbing semiconductor layer may be 300 nm to 600 nm. When the thickness of the light absorbing layer is greater than the above numerical range, it is necessary for the electron-hole pairs to travel a longer distance, which may result in a disadvantage of increased recombination, and when the thickness thereof is less than the above numerical range, the absorption of light may be reduced, which may result in a disadvantage in that the number of electron-hole pairs generated may decrease.

According to an embodiment of the present disclosure, the perovskite photoelectric conversion semiconductor device is a large-area photoelectric conversion semiconductor module, and may be electrically connected by connecting a plurality of cells in series with a monolithic structure.

A perovskite photoelectric conversion semiconductor device according to another embodiment of the present disclosure includes a substrate, a first electrode formed on the substrate, a hole transport layer formed on the first electrode, a perovskite light absorbing semiconductor layer formed on the hole transport layer, an electron transport layer formed on the perovskite light absorbing semiconductor layer, and a second electrode formed on the electron transport layer, a first pitch is formed in the first electrode, a second pitch is formed in the hole transport layer, the perovskite light absorbing semiconductor layer, and the electron transport layer, and the hole transport layer includes a hole transport layer residue in the second pitch.

Figure 3:
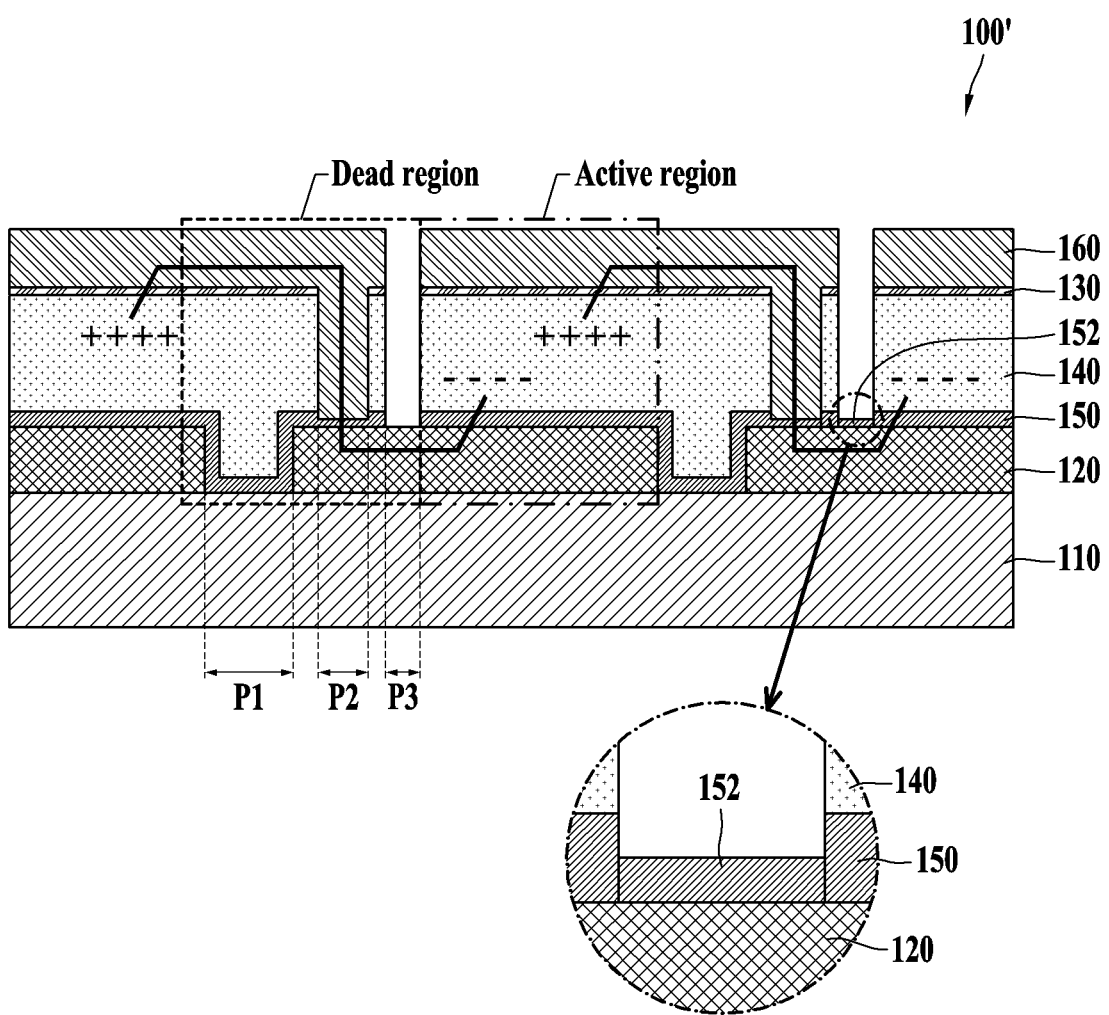
FIG. 3 is a cross-sectional view of a perovskite photoelectric conversion semiconductor device according another embodiment of the present disclosure.

FIG. 3 is a cross-sectional view of a perovskite photoelectric conversion semiconductor device according another embodiment of the present disclosure.

The perovskite photoelectric conversion semiconductor device of FIG. 3 has a positive-intrinsic-negative (PIN) structure.

Referring to FIG. 3, a perovskite photoelectric conversion semiconductor device 100' according to an aspect of the present disclosure may include a substrate 110, a first electrode 120 formed on the substrate 110, a hole transport layer 150 formed on the first electrode 120, a perovskite light absorbing semiconductor layer 140 formed on the hole transport layer 150, an electron transport layer 130 formed on the perovskite light absorbing semiconductor layer 140, and a second electrode 160 formed on the electron transport layer 130.

The perovskite photoelectric conversion semiconductor device 100 of FIG. 1 and the perovskite photoelectric conversion semiconductor device 100' of FIG. 3 have the same configurations except for the positions of the electron transport layer and the hole transport layer. Therefore, the description of the specific configurations of the substrate 110, the first electrode 120, the hole transport layer 150, the perovskite light absorbing semiconductor layer 140, the electron transport layer 130, and the second electrode 160 will be omitted because these configurations are the same as the configurations of the photoelectric conversion semiconductor device 100 of FIG. 1.

The first electrode 120 may be formed on a substrate 110 and then patterned to form the first pitch, and the hole transport layer 150 may be formed on an upper surface and side surfaces of the first electrode 120 as well as on an upper surface of the substrate 110 exposed by the pitch.

At this time, the hole transport layer 150 may maintain a constant thickness, and may desirably have a thickness of 10 nm to 500 nm. The optimal thickness varies depending on the material and device structure, however, generally, when the thickness of the hole transport layer 150 is less than 10 nm, a thickness of a film may not be constant, and when the thickness exceeds 500 nm, there is a problem that the resistance excessively increases.

A second pitch P2 may be formed in the hole transport layer 150, the perovskite light absorbing semiconductor layer 140, and the electron transport layer 130, and the second electrode 160 may be formed to cover at least a portion of the first electrode 120, the hole transport layer 150, the perovskite light absorbing semiconductor layer 140, and the electron transport layer 130.

The second pitch may be formed by patterning the hole transport layer 150, the perovskite light absorbing semiconductor layer 140, and the electron transport layer 130 for electrical conduction between separated cells.

The second pitch may include a hole transport layer residue 152.

In an embodiment, the hole transport layer residue 152 may have a thickness range of 0.1 nm to 2 nm; 0.1 nm to 1.8 nm; 0.1 nm to 1.5 nm; 0.1 nm to 1.3 nm; 0.1 nm to 1 nm; 0.1 nm to 0.8 nm; 0.1 nm to 0.5 nm; 0.1 nm to 0.3 nm; 0.5 nm to 2 nm; 0.5 nm to 1.8 nm; 0.5 nm to 1.5 nm; 0.5 nm to 1.3 nm; 0.5 nm to 1 nm; 0.5 nm to 0.8 nm; 1 nm to 2 nm; 1 nm to 1.8 nm; 1 nm to 1.5 nm; 1 nm to 1.3 nm; 1.5 nm to 2 nm; or 1.5 nm to 1.8 nm.

In an embodiment, the hole transport layer residue 152 may remain in an area of 0.05% to 99%; 0.05% to 90%; 0.05% to 80%; 0.05% to 70%; 0.05% to 60%; 0.05% to 50%; 0.05% to 40%; 0.05% to 30%; 0.05% to 20%; 0.05% to 10%; 0.05% to 5%; 0.05% to 1%; 1% to 90%; 1% to 80%; 1% to 70%; 1% to 60%; 1% to 50%; 1% to 40%; 1% to 30%; 1% to 20%; 1% to 10%; 10% to 99%; 10% to 90%; 10% to 80%; 10% to 70%; 10% to 60%; 10% to 50%; 10% to 40%;

10% to 30%; 10% to 20%; 30% to 99%; 30% to 90%; 30% to 80%; 30% to 70%; 30% to 60%; 30% to 50%; 30% to 40%; 50% to 99%; 50% to 90%; 50% to 80%; 50% to 70%; 50% to 60%; 80% to 99%; 80% to 90%; or 90% to 99% on the first electrode in the second pitch.

Like the electron transport layer residue 132 of FIG. 2, the hole transport layer residue 152 may not have a constant thickness and may be formed locally.

In an embodiment, the hole transport layer residue 152 may be formed by laser patterning, mechanical scribing, or both.

The hole transport layer residue 152 has the advantage of strengthening the adhesion strength between the second electrode and the first electrode. Normally, when a metal electrode (such as an Au or Ag thin film), which is the second electrode, is deposited and attached to a transparent electrode which is the first electrode, the adhesion strength is poor due to a difference in crystal structure and surface energy between the two thin films. Thus, methods of improving the adhesion strength may be used by forming a seed layer of Ti, Ni, Cr, etc. The hole transport layer residue 152 has high adhesion strength compared to that of the metal/transparent electrode, and when the hole transport layer residue partially remains, a surface area increases and the adhesion strength increases. When the adhesion strength is poor, there is a very high possibility that a problem arises in the long-term reliability of a large-area photoelectric conversion semiconductor device in the future.

In the case of laser patterning, laser energy or the number of patterning cycles may be increased to completely remove the hole transport layer residue, however, this may cause laser damage to other multilayer thin films. In addition, in the case of mechanical patterning scribing, a pressing force during the mechanical etching or the number of etchings may be increased to completely remove the hole transport layer residue, however, this may cause damage to the transparent electrode and glass substrate. Therefore, the excessive etching process may not be performed, and this may not cause the damage to the multilayer thin films and the process may also be simplified.

The second pitch may be formed to conduct electricity between the perovskite light absorbing semiconductor layers 140 of the separated cells, thereby allowing positive and negative charges to be formed at opposite ends within the perovskite light absorbing semiconductor layer 140.

More specifically, positive charges may be formed at the interface between the perovskite light absorbing semiconductor layer 140 and the second electrode 160, and negative charges may be formed at the interface between the perovskite light absorbing semiconductor layer 140 and the first electrode 120.

In addition, partitioned cells may be connected in series as a whole by being connected from a positive charge forming portion of the perovskite light absorbing semiconductor layer 140 in the partitioned cell to a negative charge forming portion of the perovskite light absorbing semiconductor layer 140 in an adjacent cell.

According to an embodiment of the present disclosure, a third pitch P3 may be formed in the hole transport layer 150, the perovskite light absorbing semiconductor layer 140, the electron transport layer 130, and the second electrode 160.

The third pitch may serve to partition a photoelectric conversion module of the present disclosure formed with a monolithic pattern structure into cells.

Examples

First, a glass substrate was prepared and ITO was deposited as a first electrode on the substrate. Next, the first electrode was patterned for P1 using laser patterning, and a SnO$_2$ layer was formed as an electron transport layer to cover the first electrode. Next, FAPbI$_3$ was coated as a perovskite light absorbing semiconductor layer on the electron transport layer, and NiO was formed as a hole transport layer on the perovskite light absorbing semiconductor layer. Then, the electron transport layer, the perovskite light absorbing semiconductor layer, and the hole transport layer were patterned for P2. Next, Au was deposited as a second electrode on the hole transport layer. Finally, the electron transport layer, the perovskite light absorbing semiconductor layer, the hole transport layer, and the second electrode were patterned for P3 to manufacture a perovskite photoelectric conversion semiconductor device. It was confirmed that 0.5 nm of the electron transport layer was remaining on the electron and the manufactured device operated.

Figure 4:
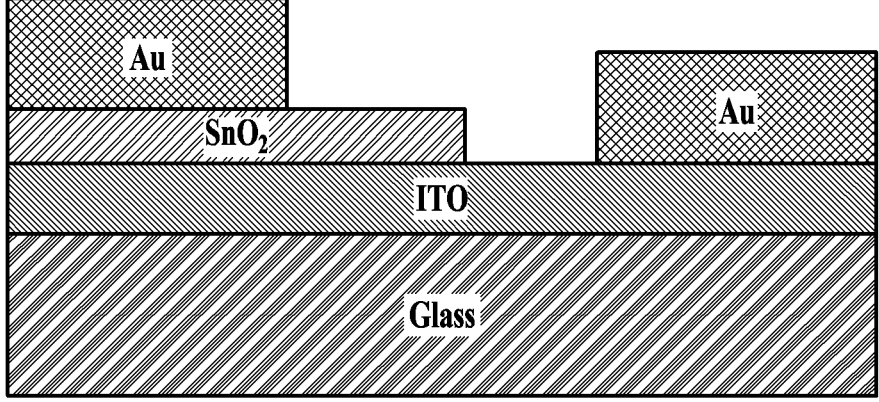
FIG. 4 is a cross-sectional view of a contact resistance measurement sample of $Au/SnO_2/ITO$ according to an embodiment of the present disclosure.

FIG. 4 is a cross-sectional view of a contact resistance measurement sample of Au/SnO$_2$/ITO according to an embodiment of the present disclosure.

In order to analyze the principle by which the device may operate when the electron transport layer remains on the electrode in the P2 portion, a sample was manufactured with a structure as shown in FIG. 4. In FIG. 4, the SnO$_2$ electron transport layer was formed to have a thickness of 0 nm, 0.1 nm, 0.5 nm, 1 nm, 2 nm, 5 nm, 10 nm, and 20 nm, and then two ends of the Au electrode were contacted to measure the current-voltage.

Figure 5:
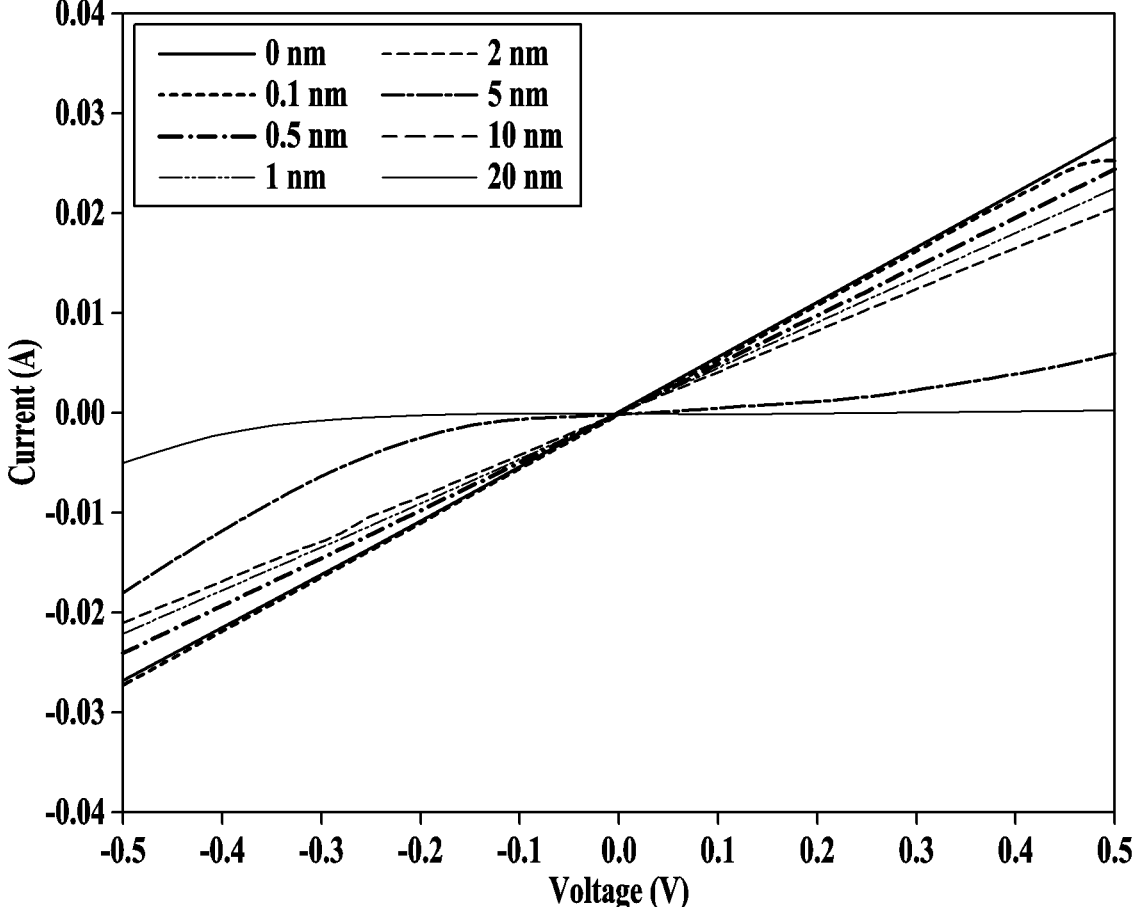
FIG. 5 is a graph showing a current-voltage measurement curve for evaluating a contact resistance of $Au/SnO_2/ITO$ according to an embodiment of the present disclosure.

FIG. 5 is a graph showing a current-voltage measurement curve for evaluating the contact resistance of Au/SnO$_2$/ITO according to an embodiment of the present disclosure.

As shown in FIG. 5, similar current-voltage curves were observed when SnO$_2$ was not formed (0 nm) and when SnO$_2$ was formed to have a thickness of about 0.1 nm, and this indicates that both cases have similar contact resistance values. In addition, when SnO$_2$ was formed to have a thickness of 0.1 nm or more and 2 nm, the contact resistance value increased slightly as the SnO$_2$ thickness increased, but a linear current-voltage curve was observed, indicating that Au/SnO$_2$/ITO still exhibited an ohmic contact. However, when the thickness of SnO$_2$ is 5 nm or more, the current-voltage curve is not shown as a linear line, indicating a rectifying or Schottky contact, which may lead to a rapid increase in contact resistance. Therefore, it may be found that the appropriate value for the thickness of the remaining SnO$_2$ needs to be 2 nm or less.

While the embodiments are described with reference to drawings, it will be apparent to one of ordinary skill in the art that various alterations and modifications in form and details may be made in these embodiments without departing from the spirit and scope of the claims and their equivalents. For example, suitable results may be achieved if the described techniques are performed in a different order, and/or if components in a described system, architecture, device, or circuit are combined in a different manner, and/or replaced or supplemented by other components or their equivalents.

Therefore, other implementations, other embodiments, and equivalents to the claims are also within the scope of the following claims.

What is claimed is:

1. A perovskite photoelectric conversion semiconductor device comprising:
   a substrate;
   a first electrode formed on the substrate;
   an electron transport layer formed on the first electrode;
   a perovskite light absorbing semiconductor layer formed on the electron transport layer;

a hole transport layer formed on the perovskite light absorbing semiconductor layer; and
a second electrode formed on the hole transport layer,
wherein a first pitch is formed in the first electrode,
a second pitch is formed in the electron transport layer, the perovskite light absorbing semiconductor layer, and the hole transport layer, and
the electron transport layer comprises an electron transport layer residue in the second pitch.

2. The perovskite photoelectric conversion semiconductor device of claim 1, wherein the electron transport layer residue has a thickness range of 0.1 nanometers (nm) to 2 nm.

3. The perovskite photoelectric conversion semiconductor device of claim 1, wherein the electron transport layer residue is included in an area of 0.05% to 99% on the first electrode in the second pitch.

4. The perovskite photoelectric conversion semiconductor device of claim 1, wherein the electron transport layer residue is formed locally.

5. The perovskite photoelectric conversion semiconductor device of claim 1, wherein the electron transport layer residue is formed by laser patterning, mechanical scribing, or both.

6. The perovskite photoelectric conversion semiconductor device of claim 1, wherein the electron transport layer or the hole transport layer is formed to cover at least a portion of the first electrode and the substrate.

7. The perovskite photoelectric conversion semiconductor device of claim 1, wherein the second electrode is formed to cover at least a portion of the first electrode, the electron transport layer, the perovskite light absorbing semiconductor layer, and the hole transport layer.

8. The perovskite photoelectric conversion semiconductor device of claim 1, wherein a third pitch is formed in the electron transport layer, the hole transport layer, the perovskite light absorbing semiconductor layer, and the second electrode.

9. The perovskite photoelectric conversion semiconductor device of claim 1, wherein
   the first electrode, the second electrode, or both are a transparent electrode or a metal electrode,
   the transparent electrode comprises one or more selected from the group consisting of indium tin oxide (ITO), fluorine-doped tin oxide (FTO), SnO$_2$, Al:ZnO, B-doped ZnO (B:ZnO), graphene, poly(3,4-ethylenedioxythiophene) polystyrene sulfonate (PEDOT:PSS), Ag nanowires, and graphene and carbon nanotubes, and
   the metal electrode comprises one or more selected from the group consisting of Au, Ag, Ni, Cu, Mo, Pt, W, Al, and an alloy thereof.

10. The perovskite photoelectric conversion semiconductor device of claim 1, wherein the electron transport layer further comprises one or more selected from the group consisting of TiO$_2$, SnO$_2$, WS$_2$, WSe$_2$, ZnO, and C$_{60}$.

11. The perovskite photoelectric conversion semiconductor device of claim 1, wherein the hole transport layer further comprises one or more selected from the group consisting of NiO$_x$, Spiro-OMeTAD, PTAA, P$_3$HT, PEDOT:PSS, and a self-assembled monolayer.

12. The perovskite photoelectric conversion semiconductor device of claim 1, wherein
   the perovskite light absorbing semiconductor layer comprises a compound having an ABX$_3$ structure,
   the A is one or more selected from the group consisting of methylammonium, formamidinium, Cs, and Rb, the B is one or more selected from the group consisting of Pb, Sn, Ge, Sb, and Bi, and the X is one or more selected from the group consisting of I, Br, and Cl.

13. The perovskite photoelectric conversion semiconductor device of claim 1, wherein the perovskite light absorbing semiconductor layer is a large-area photoelectric conversion module and is electrically connected by connecting a plurality of cells in series in a monolithic structure.

\* \* \* \* \*